United States Patent [19]

Duong et al.

[11] Patent Number: 5,656,950
[45] Date of Patent: Aug. 12, 1997

[54] INTERCONNECT LINES INCLUDING TRI-DIRECTIONAL BUFFER CIRCUITS

[75] Inventors: Khue Duong; Stephen M. Trimberger, both of San Jose, Calif.

[73] Assignee: Xilinx, Inc., San Jose, Calif.

[21] Appl. No.: 548,791

[22] Filed: Oct. 26, 1995

[51] Int. Cl.[6] .................... H03K 19/177; H03K 19/173
[52] U.S. Cl. ................... 326/41; 326/39; 326/47
[58] Field of Search .................. 326/41, 47, 39

[56] References Cited

U.S. PATENT DOCUMENTS

| Re. 34,363 | 8/1993 | Freeman | 326/41 |
| 4,642,487 | 2/1987 | Carter | 326/41 |
| 4,695,740 | 9/1987 | Carter. | |
| 4,713,557 | 12/1987 | Carter. | |
| 4,835,415 | 5/1989 | Hsieh. | |
| 5,497,108 | 3/1996 | Menon et al. | 326/39 |
| 5,512,765 | 4/1996 | Gaverick | 326/41 |

*Primary Examiner*—Edward P. Westin
*Assistant Examiner*—Richard Roseen
*Attorney, Agent, or Firm*—Wagner, Murabito & Hao; Jeanette S. Harms

[57] ABSTRACT

A metal interconnect line for conducting a first signal from a first line segment of a field programmable gate array to a second line segment. The metal interconnect line substantially spans across the width of the field programmable gate array and has at least one bi-directional buffer that separates the metal interconnect line into a plurality of independent segments. Each of these segments can conduct signals independently from the other segments when the bidirectional buffer is in a tristate mode. Alternatively, a single signal may be routed through the entire length of the metal line in one or the other direction, and repowered along the way. One or more of the bi-directional buffers are used to actively drive the signal(s) onto later segments of the metal interconnect line.

13 Claims, 7 Drawing Sheets

INTERCONNECT LINES INCLUDING TRI-DIRECTIONAL BUFFER CIRCUITS

FIELD OF THE INVENTION

The present invention pertains to a flexible and fast interconnect scheme for routing signals within a field programmable gate array.

BACKGROUND OF THE INVENTION

Integrated circuit (IC) semiconductor chips are the critical components found in virtually all modern telecommunications, computer, and electronics products. Many of these semiconductor chips are custom-made and tailored to the exact specifications supplied by the designers. However, these dedicated custom chips can be quite expensive to produce. Hence, they are not ideally suited for those instances where only a limited quantity of chips are desired. Furthermore, it can take quite a long time to fabricate these custom chips. In today's competitive environment, time-to-market is of utmost importance. Crucial market share might be irretrievably lost while a company waits for its custom chips to be produced and delivered. And if there is an error somewhere in the initial design or layout, more delays are incurred in fixing the problems.

In response to the shortcomings inherent to custom IC chips, field-programmable gate arrays (FPGAs) were developed. An FPGA is a standard off-the-shelf semiconductor chip that can be individually programmed to perform the desired functions. An FPGA can be reprogrammed an unlimited number of times and can be used in innovative designs where hardware is changed dynamically, or where hardware must be adapted to different user applications. An FPGA is typically comprised of three major configurable elements: configurable logic blocks (CLBs), input/output blocks (IOBs), and interconnect lines. The CLBs provide the functional elements for constructing the desired logic. The IOBs provide the interface between the package pins and internal signal lines. Finally, the interconnect lines provide routing paths to connect the input and output terminals of the CLBs and IOBs onto the appropriate networks. The desired circuit design is established by programming internal static memory cells to control the logic functions and interconnections that are used to produce the desired results.

Typically, there are three main types of interconnect lines, which are distinguished by the relative length of their segments: single-length lines, double-length lines, and long lines. The single-length lines are comprised of a grid of horizontal and vertical metal lines that intersect at a switch matrix between each CLB. The switch matrix, which includes a plurality of programmable transistors, establishes connections between the single-length lines. The double-length lines consist of a grid of metal segments that are twice as long as the single-length lines. Hence, a double-length line runs past two CLBs before entering a switch matrix. Long lines form a grid of metal interconnect segments that run the entire length or width of an array.

FIG. 1 illustrates a prior art FPGA 101 which includes CLBs 102–117, decoders 118–121, IOBs 122–125, and long lines 126–131. Each of the long lines 126–131 has a programmable splitter switch positioned approximately at its center. These splitter switches 132–137 enable the long lines 126–131 to be separated into two independent routing channels, each of which runs half the width or height of the array. For example, splitter switch 134 can be closed so that the segments 138 is electrically connected to segment 139. Hence, a signal originating from CLB 104 can be routed by long line 129 to CLB 116. Alternatively, splitter switch 134 can be in an open position so that the two segments 138 and 139 are separate, thereby allowing segment 138 to conduct signals between CLB 104 and CLB 108 and segment 139 to conduct signals between CLB 112 and CLB 116. However, one shortcoming associated with FPGA 101 is that a long line can only conduct a maximum of two signals at any given time. Hence, a need arises for a different, more flexible approach that allows more signals to be handled by a long line, and yet retains the capability of a long line to conduct a signal the full width or height of the array.

Another disadvantage of FPGA 101 is that the long lines are often used in part of a critical path. As such, it is essential that the signals on the critical path be routed as quickly as possible to increase the overall speed of the chip. In typical FPGAs, the long lines are made of passive metal conductors, wherein the splitter switches simply connect and disconnect the long line segments. Therefore, a further need arises for a mechanism that actively drives the signals on a long line so as to speed up critical path signals. Moreover, it would be preferable if such a mechanism were bi-directionally buffered so that signals could be actively driven in either direction on a long line.

Buffers are advantageously inserted and used in a conductive line when the effect of the buffer is to increase the speed of signal flow. Short lines are typically connected together by pass transistors or transmission gates which are not buffered because the buffer would slow down the signal flow. In a typical FPGA, a number of horizontal and vertical long interconnect lines spanning the array are used to carry signals from one configurable logic block to another configurable logic block. Connections from one long line to another are typically buffered because the buffer increases the speed of signal flow (the performance).

SUMMARY OF THE INVENTION

The present invention pertains to long interconnect lines that can be segmented and buffered for routing signals in a field programmable gate array. The field programmable gate array is comprised of an array of configurable logic blocks that are used to perform pre-programmed logic functions. According to the invention, lines on which speed of signal flow can be increased by buffering have at least one bi-directional buffer interposed therein. The bi-directional buffers are used to selectively separate a long interconnect line into a number of segments and buffer signals placed onto the line. The signals can be driven in either direction by the bi-directional buffers. In one embodiment, the bi-directional buffers are tristated to separate the segments so each segment can be used independent of the others.

BRIEF DESCRIPTION OF THE DRAWINGS

The present invention is illustrated by way of example, and not byway of limitation, in the figures of the accompanying drawings and in which like reference numerals refer to similar elements and in which.

DETAILED DESCRIPTION OF THE INVENTION

The term "long" will be used here to describe any line in which the signal speed can be increased by buffering. Thus the term "long" may refer to lines which are relatively short physically, but are heavily loaded so that buffering increases signal speed. In a location where buffering is determined not to increase speed, a line may be segmented by a simple pass transistor or transmission gate so that the buffer does not slow down the signal.

Figure 1:
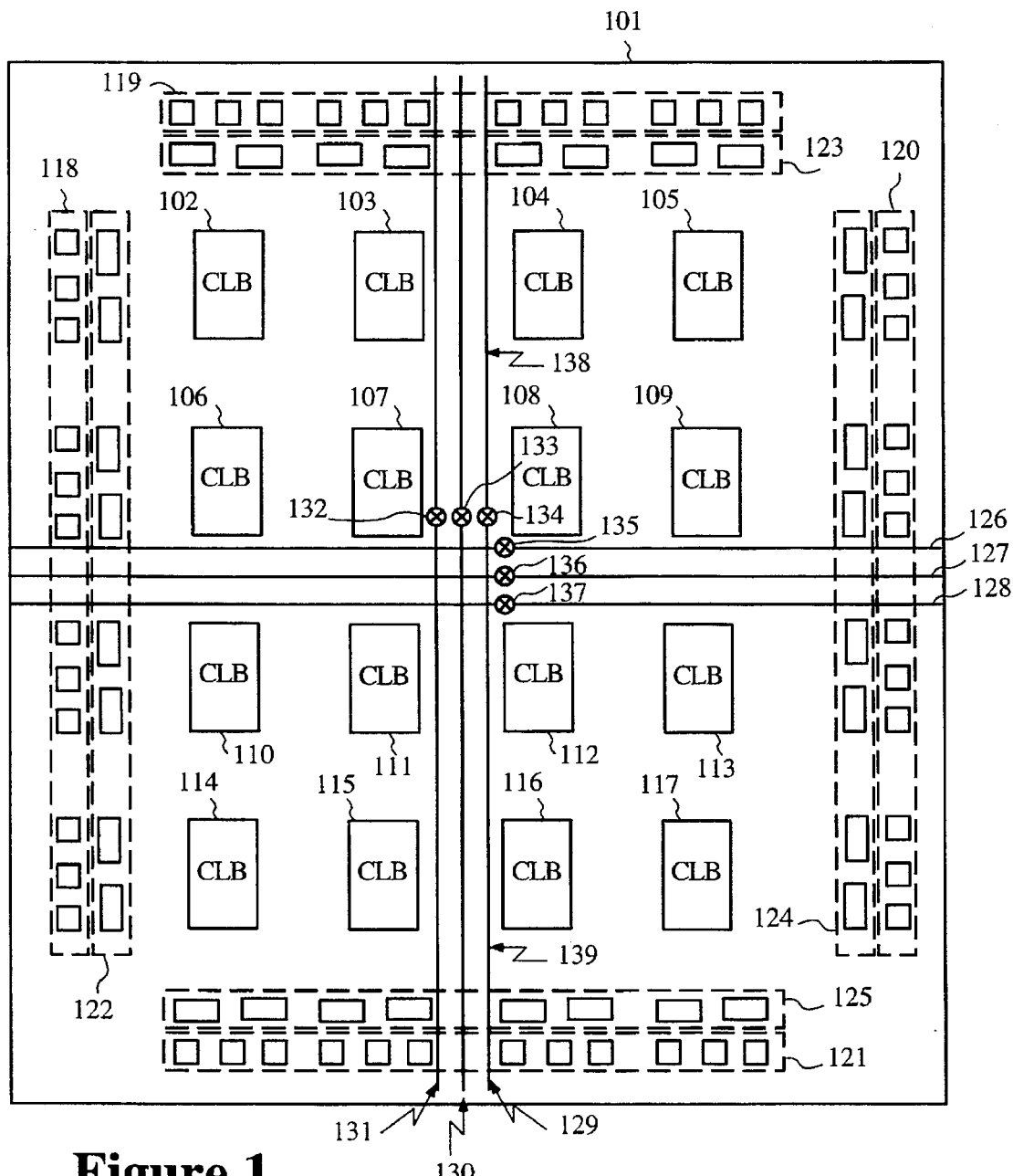
FIG. 1 illustrates a prior art field programmable gate array.
Figure 2:
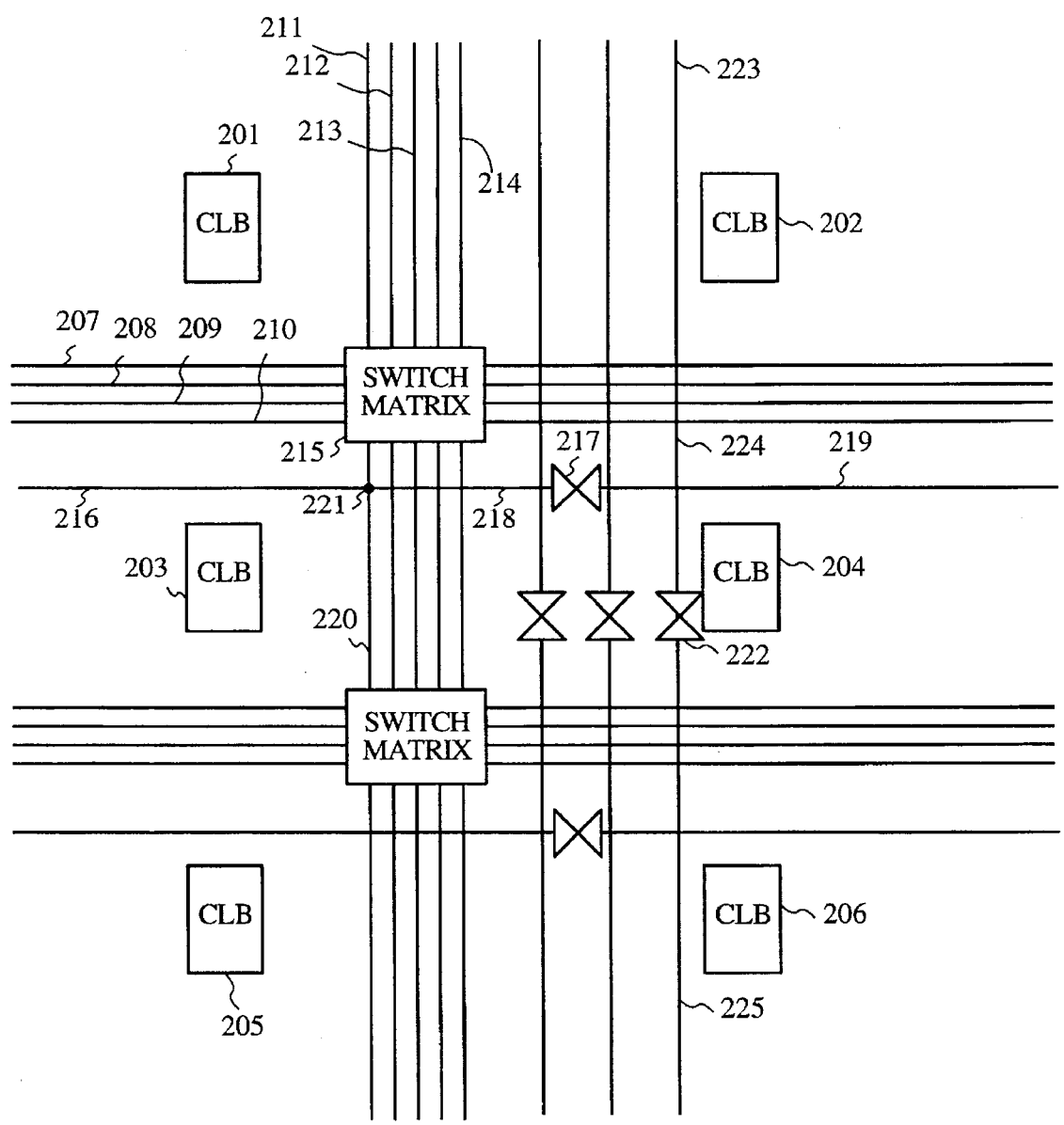
FIG. 2 shows a portion one embodiment of the segmented bi-directionally driven long line interconnect scheme of the present invention.

FIG. 2 shows a portion of one embodiment of a segmented bi-directionally driven "long" line interconnect scheme of the present invention. An FPGA typically has a square CLB matrix (8×8, 10×10, 12×12, 14×14, 16×16, 18×18, 20×20, 24×24, 28×28, 32×32, etc.). Consequently, there may be as few as 64 or as many as 1,024 plus CLBs contained within an FPGA chip. In FIG. 2, only six representative CLBs 201–206 are shown. However, the present invention applies to any CLB matrix size. Moreover, the configuration of a CLB may include one or more elements, such as function generators, flip-flops, buffers, multiplexers, and registers. The present invention also applies equally to any kind of CLB configuration.

Each CLB contains input and output ports. These input/output ports are programmably interconnected by single-length metal lines having programmable switching points and switching matrices. For example, CLB 201 can be locally coupled to surrounding neighbor CLBs via any of the single-length lines 207–214 through switch matrix 215 (the actual lines connecting CLB 201 to the single-length lines not shown). Switch matrix 215 includes programmable n-channel pass transistors used to establish connections between single-length lines 207–214. In some embodiments, double-length lines (twice as long as the single-length lines) (not shown for simplicity) are used to run past two CLBs before they enter a switch matrix. Double-length lines are grouped in pairs with the switch matrices staggered so that each line goes through a switch matrix at every other CLB location in that row or column.

Figure 3:
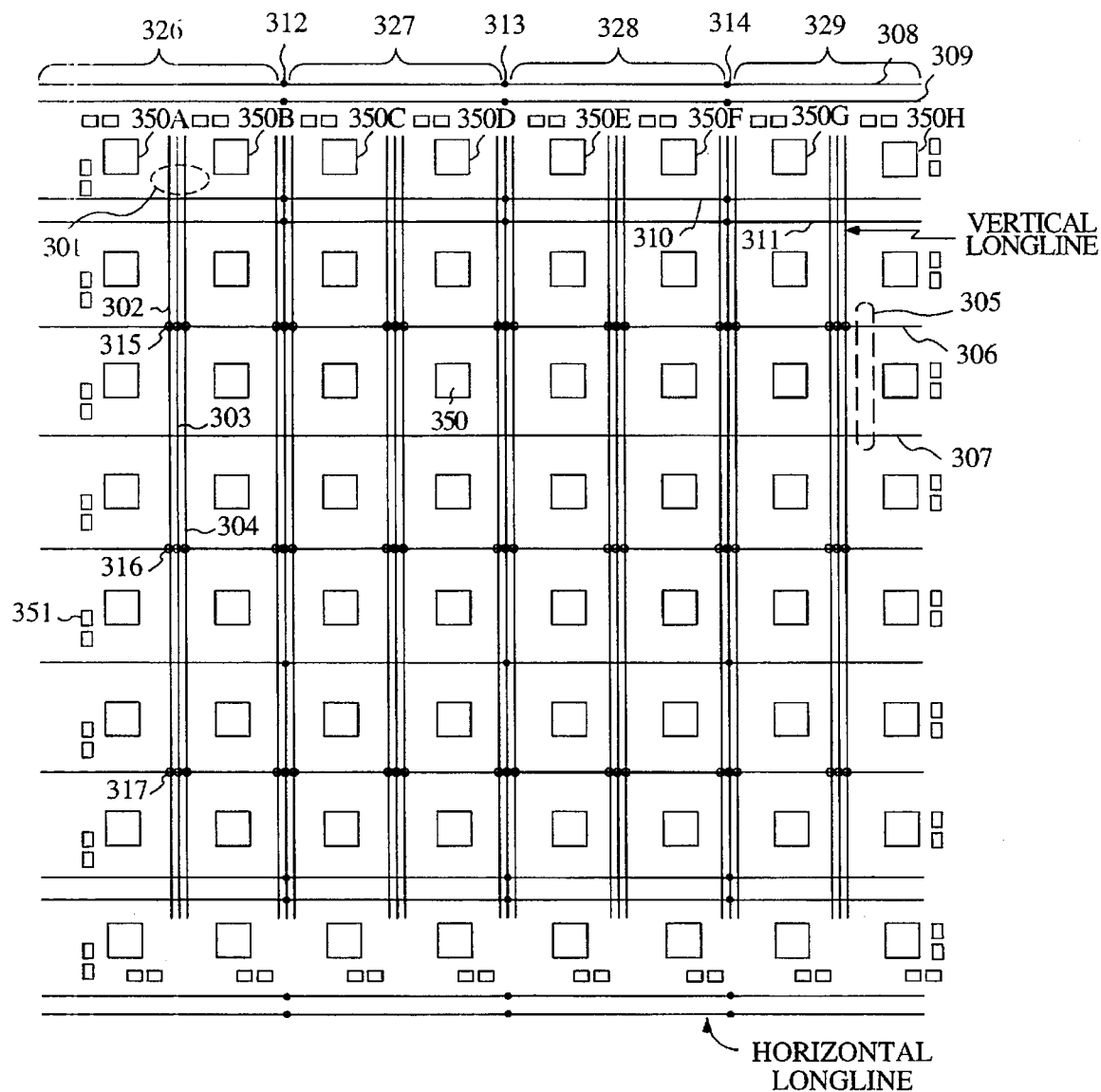
FIG. 3 shows another embodiment of the present invention in which the long lines are separable into four segments by implementing three bi-directional buffers per vertical and horizontal long line.

A number of long lines are used to provide routing resources to carry signals at greater distances. Horizontal and vertical long lines typically span the entire width or height of the chip to minimize delay and skew, but of course may span a shorter distance if they can be used to drive many loads or large loads. In FIG. 3, the long lines form a grid of metal interconnect segments that run the height or width of the array and bypass the switch matrices. In one embodiment, vertical long lines, driven by special global buffers, distribute clock signals and other high fanout control signals throughout the array with minimal skew.

In the present invention, at least one long line is broken into two or more segments by implementing a bi-directional buffer. Bidirectional buffer 217 has been located between line segments 218 and 219 because these segments may be sufficiently heavily loaded that bidirectional buffer 217 will speed up signal flow. For example, horizontal long line 216 is capable of being broken into two segments (i.e. two independent routing channels) 218 and 219 by a bi-directional buffer 217. Bi-directional buffer 217 can drive a signal from long line segment 218 to long line segment 219, or from long line segment 219 to segment 218, or can be tristated to separate the two segments. Similarly, a bi-directional buffer 222 selectively drives a signal in either direction or neither direction on line segments 224 and 225.

It should be noted that numerous bi-directional buffers can be implemented to break a horizontal or vertical long line into multiple segments. Pass gates may be interspersed with bidirectional buffers along the same long line for maximum speed. The number of routing channels shown in the figures of this patent are for illustration purposes only. The actual number of routing channels and long lines varies with the array size and chip capacity. For example, FIG. 3 shows one embodiment of the present invention where the long lines are separable into four segments by implementing three bi-directional buffers per vertical or horizontal long line. In the FPGA configuration shown in FIG. 3, an 8×8 array of CLBs 350 is shown. The CLB array is bordered with a number of IOBs 351.

In this embodiment, each interconnection column or row has associated long lines. For example, interconnection column 301 includes three vertical long lines 302–304, whereas interconnection row 305 includes two horizontal long lines 306 and 307. Furthermore, additional horizontal long lines, for example, long lines 309 and 310, are provided adjacent to each row of IOBs 351. Each horizontal long line has three bi-directional buffers (represented by the solid dots). For example, long line 308 has three bi-directional buffers 312–314. Similarly, each of the vertical long lines has three corresponding bi-directional buffers. For example, vertical long line 302 has three bi-directional buffers 315–317 (represented by a circle). The above referenced bi-directional buffers (solid dots or circles) enable the horizontal and vertical long lines to function either as one continuous segment, two independent segments, or four independent segments. For example, bi-directional buffers 312–314 can be programmed such that horizontal long line 308 is broken into four independent segments 326–329. Hence, a first signal can be routed from CLB 350A to CLB 350B via long line segment 326; a second signal can be routed from CLB 350C to CLB 350D via long line segment 327; a third signal can be routed from CLB 350E to CLB 350F via long line segment 328; and a fourth signal can be routed from CLB 350G to CLB 350H via long line segment 329. It should be noted that, in the present invention, additional bi-directional buffers may be used to enable a long line to be broken into more sections. Furthermore, one may choose to use the bi-directional buffers only on a portion of the long lines. For instance, only the outer long lines might have bi-directional buffers. The other long lines can be normal, unbroken long lines.

Figure 4:
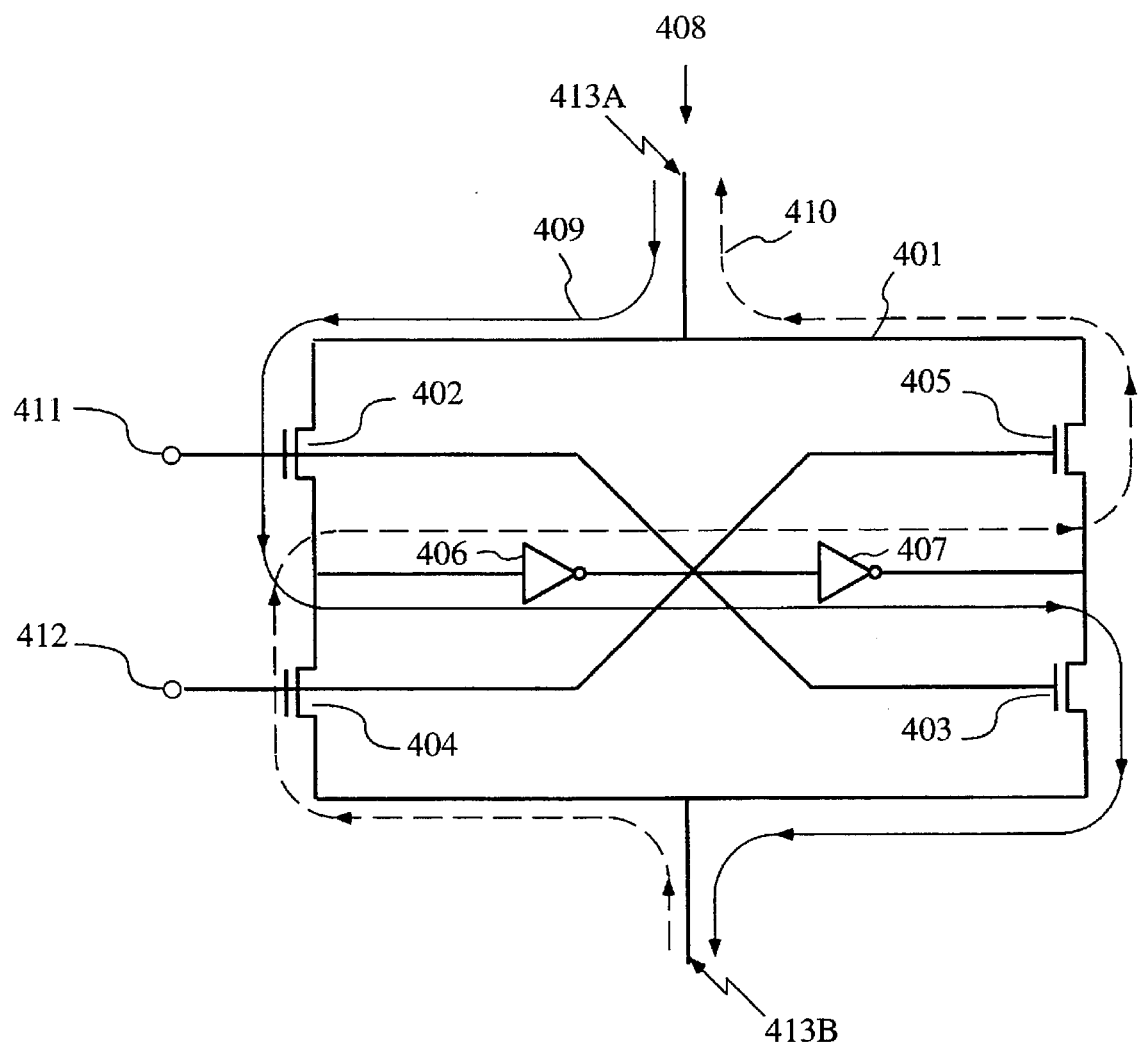
FIG. 4 illustrates a circuit diagram of one of a bi-directional buffer as can be used to segment a long line.

FIG. 4 illustrates one embodiment of a bi-directional buffer 401 to segment a long line, and provide periodic signal isolation and restoration for improved performance of lengthy signal nets. Bi-directional buffer 401, which is provided on a vertical long line 408, includes four pass transistors 402–405 and a buffer comprising two inverters 406 and 407. If a signal is routed from a top segment 413A of vertical long line 408 to its bottom segment 413B, a high signal (e.g., +5 volts) is applied to node 411 and a low signal (e.g., 0 volts) is applied to node 412. The high signal on the gates of pass transistors 402 and 403 causes them to conduct, whereas the low signal on the gates of pass transistors 404 and 405 causes them to be non-conducting. Hence, the signal starts from segment 413A, passes through transistor 402, is driven by inverters 406 and 407, and passes through transistor 403 to segment 413B. A signal flowing from top to bottom of vertical long line 408 is traced by the solid line 409.

If a signal is routed from segment 413B of vertical long line 408 to segment 413A, a low signal is applied to node 411 and a high signal is applied to node 412. The low signal on the gates of pass transistors 402 and 403 causes them to turn off, whereas the high signal on the gates of pass transistors 404 and 405 causes them to be conducting. Hence, the signal starts from segment 413B, passes through transistor 404, is driven by inverters 406 and 407, and passes through transistor 405 to segment 413A. A signal flowing from bottom to the top segment of vertical long line 408 is traced by the dashed line 410. These and other embodiments of bi-directional buffers are described in detail in U.S. Pat. No. 4,695,740 (issued on Sep. 22, 1987 to Carter); U.S. Pat. No. 4,713,557 (issued on Dec. 15, 1987 to Carter), and U.S. Pat. No. 4,835,418 (issued on May 30, 1989 to Hsieh).

Figure 5:
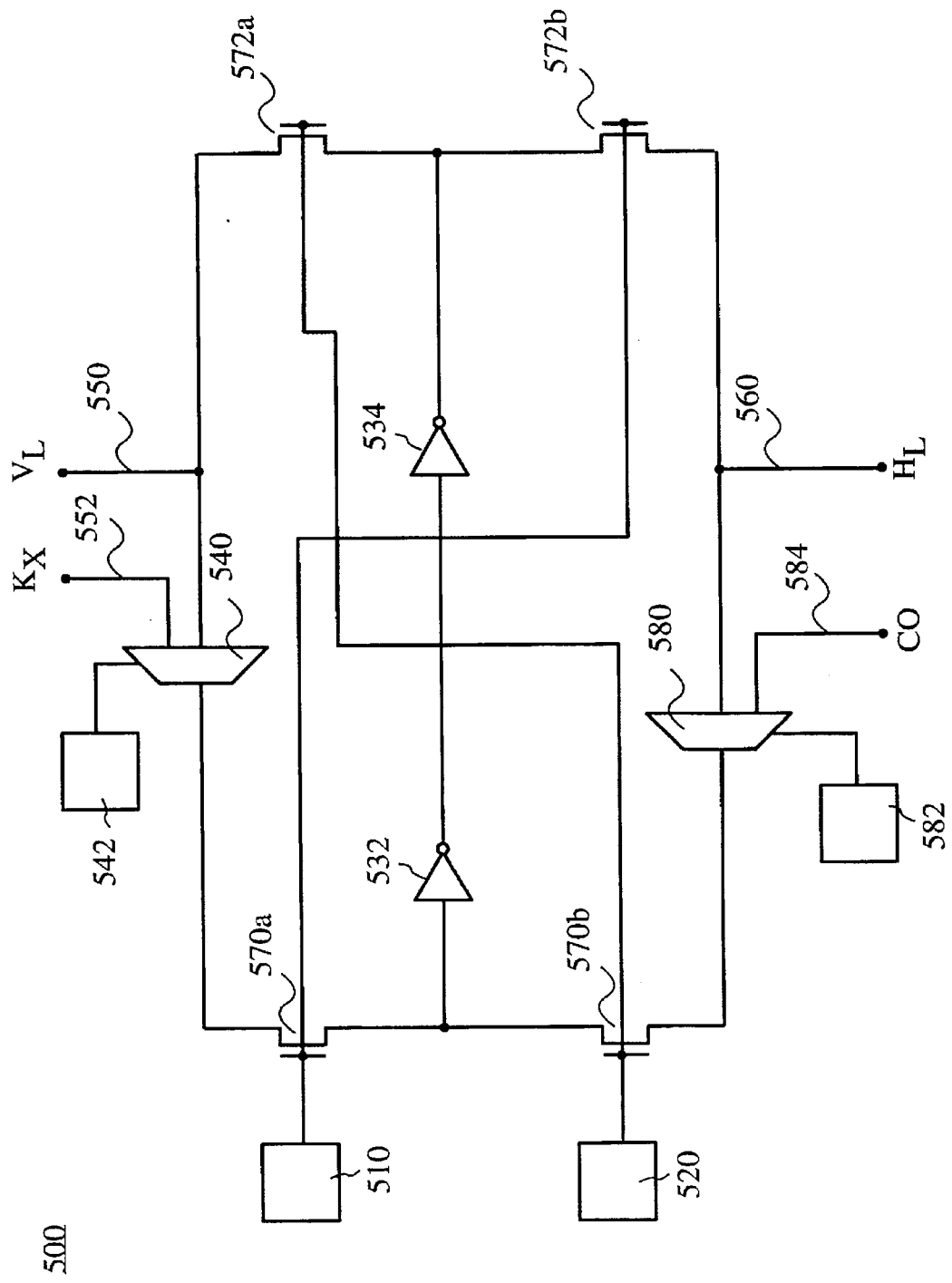
FIG. 5 shows a bi-directional, multiple-source buffer circuit, which can be used to buffer and drive the various signals of the present invention.

FIG. 5 shows a multi-directional, multiple-source buffer circuit 500, which can be used to buffer and drive the various signals of the present invention. Circuit 500 is described below and also within incorporated U.S. Pat. No. 5,583,452, entitled "Tri-Directional Buffer," by K. Duong and assigned to the assignee of the present invention. The circuit 500 allows a signal over line 584 or over line 560 to be sourced, buffered by circuits 532, 534 and driven over line 550. Multiplexer 580 provides the selection between lines 584 and 560 as the source of the signal. When memory cell 582 is programmed such that multiplexer 580 selects the HL input/output line 560 as input, and memory cell 510 contains a "0" and memory cell 520 contains a "1," then transistor 570b is ON, transistor 572a is ON and transistors 570a and 572b are OFF. This configuration allows a signal entering over line 560 to be buffered by buffer circuits 532 and 534 and output over input/output line 550. The value of memory cell 542 is ignored in this configuration.

Figure 6:
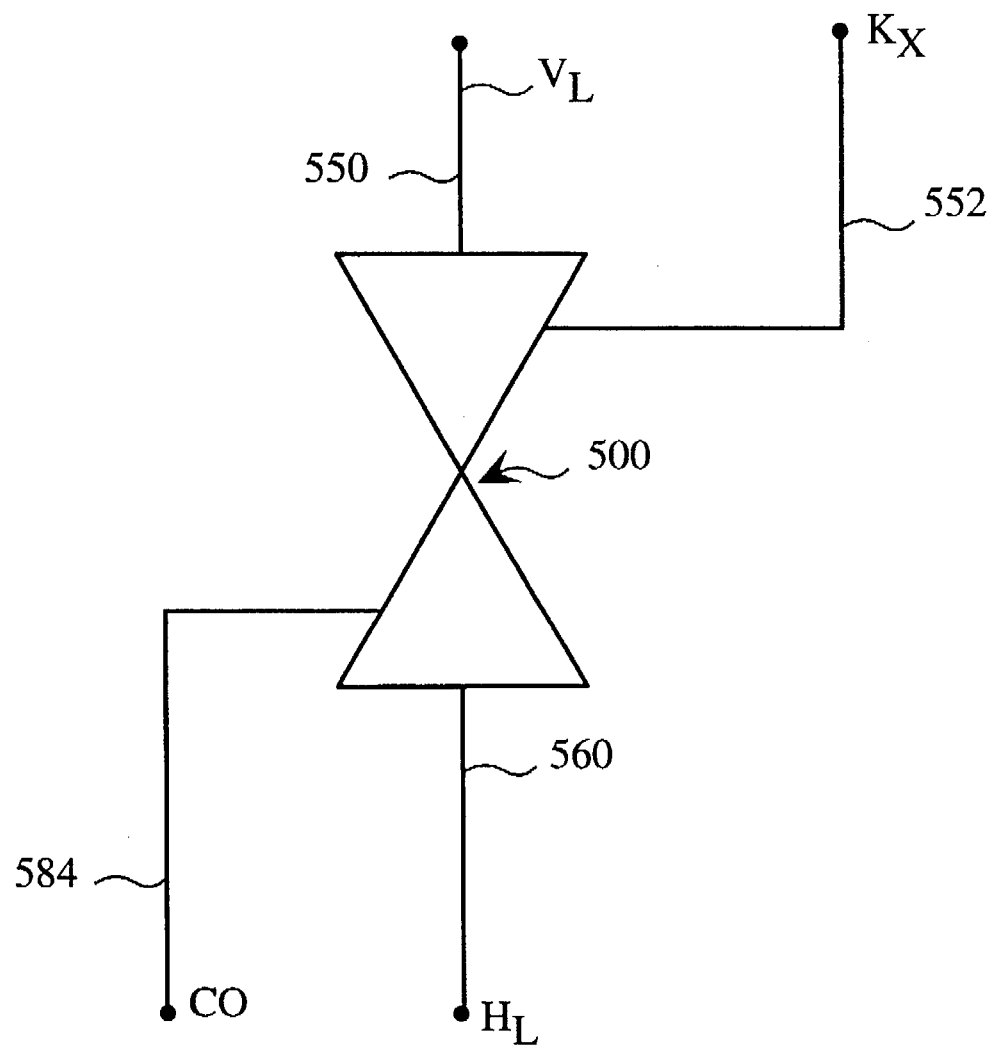
FIG. 6 is a logical block diagram of the bi-directional, multiple-source buffer circuit illustrating the auxiliary input signal, the auxiliary input signal, the input/output line, and the input/output line.

FIG. 6 is a logical block diagram of the circuit 500 of FIG. 5 illustrating the auxiliary input signal 552, the auxiliary input signal 584, the input/output line 550, and the input/output line 560. There are a number of well known methods and procedures that can be used within the scope of the present invention to program the memory cells 542, 510, 520, and 582 of circuit 500 to allow selection of either line 552 or line 550 as the source input or to allow selection of either line 584 or line 560 as the source input. Table I below illustrates an exemplary truth table.

TABLE I

| Cell 582 | Cell 542 | Cell 510 | Cell 520 | Configuration |
| --- | --- | --- | --- | --- |
| X | 0 | 1 | 0 | Drive from 550 to 560 |
| X | 1 | 1 | 0 | Drive from 552 to 560 |
| 0 | X | 0 | 1 | Drive from 560 to 550 |
| 1 | X | 0 | 1 | Drive from 584 to 550 |
| X | X | 0 | 0 | Open Circuit |

X = Don't Care

When memory cell 582 of FIG. 5 is programmed such that multiplexer 580 selects the CO input line 584 as input, and memory cell 510 contains a "0" and memory cell 520 contains a "1," then transistor 570b is ON, transistor 572a is ON and transistors 570a and 572b are OFF. This configuration allows a signal entering over line 584 to be buffered by buffer circuits 532 and 534 and output over input/output line 550. The value of memory cell 542 is ignored in this configuration.

When memory cell 510 contains a "1" and memory cell 520 contains a "0," then transistor 570a is ON, transistor 572b is ON and transistors 570b and 572a are OFF. This allows a signal entering over line 550 or line 552 (depending on the state of memory cell 542) to be buffered by buffer circuits 532 and 534 and output over input/output line 560. In this configuration, the state of the memory cell 582 is ignored.

Circuit 500 of FIG. 5 is multi-directional because either input line 584 or input/output line 560 can be sourced, buffered by circuits 532 and 534, and driven over input/output line 550. In this way, an auxiliary signal over line 584 (e.g., a carry out signal) can be buffered by circuit 500. Circuit 500 also allows a signal input over 550 to be buffered by circuits 532 and 534 and output over line 560.

Figure 7:
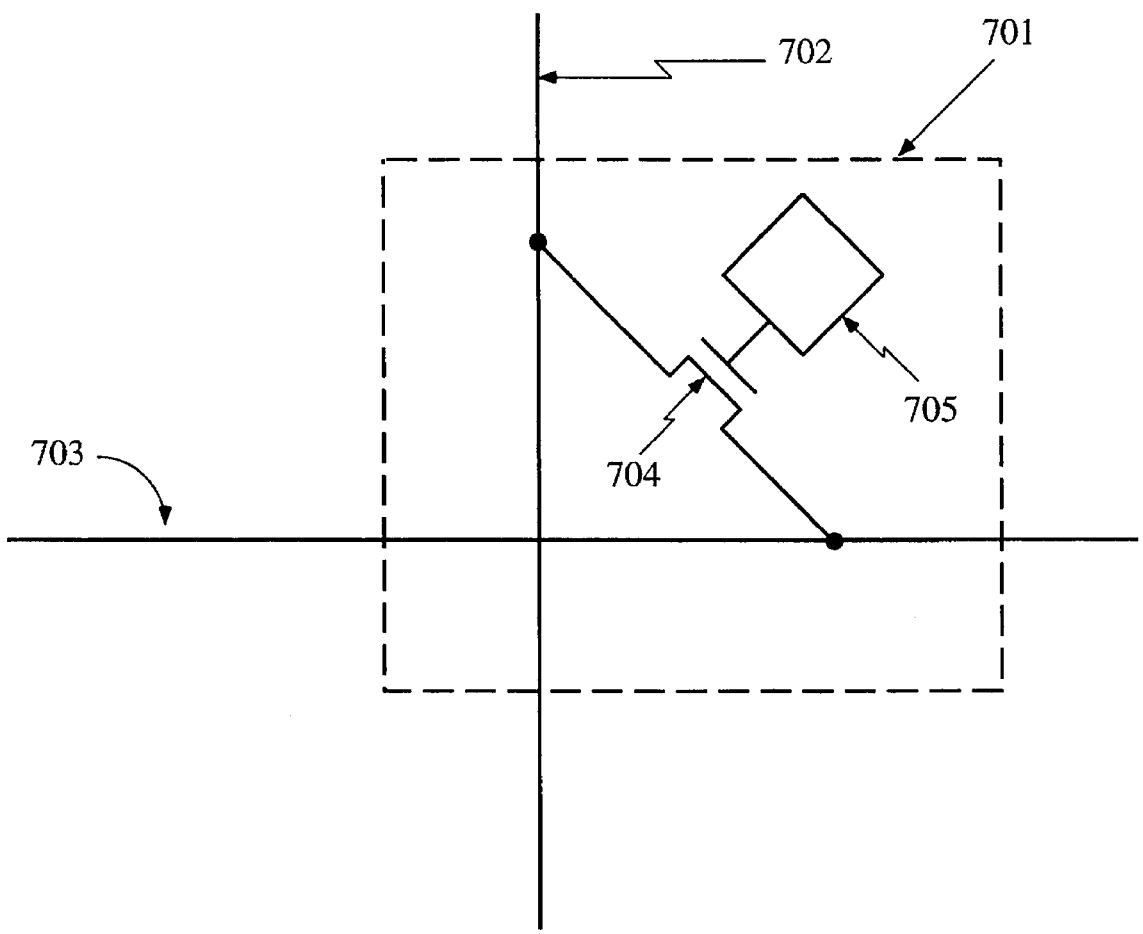
FIG. 7 shows a typical programmable interconnect point.

FIG. 7 shows an exemplary programmable interconnect point (PIP) which includes a pass transistor 704 having its gate coupled to a programmable memory cell 705. Memory cell 705 can be programmed to contain information that either turns on or turns off transistor 704. If turned or programmed ON, transistor 704 electrically connects lines 702 and 703. If turned or programmed OFF, transistor 704 does not connect lines 702 and 703.

The foregoing descriptions of specific embodiments of the present invention have been presented for purposes of illustration and are not intended to be exhaustive or to limit the invention to the precise forms disclosed. The embodiments were chosen and described to best explain the principles of the invention and its practical application, thereby enabling those skilled in the art to utilize the invention. Many modifications and variations are possible in light of the above teaching. It is intended that the scope of the invention only be defined by the claims appended hereto and their equivalents.

What is claimed is:

1. A field programmable interconnect structure comprising:

a long line; and
   at least one buffer circuit placed into said long line, thereby dividing said long line into a first input/output conductor and a second input/output conductor, wherein said at least one buffer circuit includes:
   a first input line;
   means for selecting between a first signal on said first input/output conductor and a second signal on said first input line:
   a driver circuit coupled to said first input/output conductor, said means for selecting, and said second input/output conductor;
   means for enabling said driver circuit to provide an output signal of said means for selecting to said second input/output conductor; and
   means for enabling said driver circuit to provide a third signal on said second input/output conductor to said first input/output conductor.

2. A field programmable interconnect structure as in claim 1 further comprising:

a plurality of configurable logic blocks;
   a plurality of interconnect lines;
   means for connecting said configurable logic blocks to said interconnect lines; and
   means for connecting said interconnect lines to said long line.

3. A field programmable interconnect structure as in claim 1 further including a plurality of long lines.

4. A field programmable interconnect structure as in claim 1 in which said buffer circuit can be placed into a tristate mode, thereby isolating said first and second input/output conductors from each other.

5. A field programmable interconnect structure as in claim 1 in which said long line is approximately the length of an integrated circuit chip in which said long line is formed.

6. A field programmable interconnect structure as in claim 2 in which said at least one long line is approximately the length of four of said configurable logic blocks.

7. A field programmable interconnect structure as in claim 2 in which said long line is divided into four segments by three buffer circuits.

8. A field programmable interconnect structure as in claim 1 further including:

a second input line; and means for choosing between said third signal on said second input/output conductor and a fourth signal on said second input line, said driver circuit further coupled to said means for choosing.

9. A field programmable interconnect structure as in claim 1 further including a plurality of buffer circuits on said long line, thereby providing a multi-segmented long line, and at least one continuous, uninterrupted long line.

10. An interconnect device comprising:

a first input/output conductor;

a second input/output conductor;

an input line;

a first multiplexer coupled to said first input/output conductor and said input line;

a driver circuit coupled to said first input/output conductor, said first multiplexer, and said second input/output conductor;

means for enabling said driver circuit to provide an output signal of said first multiplexer to said second input/output conductor; and means for enabling said driver circuit to provide a third signal on said second input/output conductor to said first input/output conductor.

11. The interconnect structure of claim 10 further including:

a second input line; and a second multiplexer coupled to said second input/output conductor and said second input line, said driver circuit further coupled to said second multiplexer.

12. A field programmable chip comprising:

a plurality of configurable logic blocks;

a plurality of interconnect lines for interconnecting said configurable logic blocks;

a switch matrix coupled to said interconnect lines for electrically conducting a signal from a first interconnect line to a second interconnect line;

a plurality of long lines for conducting signals thereupon;

at least one programmable buffer circuit provided at an intermediate point on one of said long lines, thereby dividing said long line into a first input/output conductor and a second input/output conductor, wherein said at least one buffer circuit includes:

a first input line;

means for selecting between a first signal on said first input/output conductor and a second signal on said first input line;

a driver circuit coupled to said first input/output conductor, said means for selecting, and said second input/output conductor;

means for enabling said driver circuit to provide an output signal of said means for selecting to said second input/output conductor; and means for enabling said driver circuit to provide a third signal on said second input/output conductor to said first input/output conductor; and a programmable device for connecting at least one long line to at least one interconnect line.

13. The interconnect structure of claim 12 further including:

a second input line; and means for choosing between a third signal on said second input/output conductor and a fourth signal on said second input line, said driver circuit further coupled to said means for choosing.

\* \* \* \* \*